United States Patent [19]
Williams

[11] Patent Number: 5,585,991
[45] Date of Patent: Dec. 17, 1996

[54] PROTECTIVE CIRCUIT FOR PROTECTING LOAD AGAINST EXCESSIVE INPUT VOLTAGE

[75] Inventor: Richard K. Williams, Cupertino, Calif.

[73] Assignee: Siliconix Incorporated, Santa Clara, Calif.

[21] Appl. No.: 325,860

[22] Filed: Oct. 19, 1994

[51] Int. Cl.$^6$ ........................................ H02H 5/04
[52] U.S. Cl. .............................. 361/30; 361/33; 361/101; 361/86; 361/111
[58] Field of Search .................... 361/18, 21, 33, 361/86, 91, 88, 78–79, 30, 82, 87, 101, 111; 323/284; 257/355–363

[56] References Cited

U.S. PATENT DOCUMENTS

| | | | |
|---|---|---|---|
| 5,027,181 | 6/1991 | Larik et al. | 257/379 |
| 5,302,889 | 4/1994 | Marsh | 323/284 |
| 5,517,379 | 5/1996 | Williams et al. | 361/84 |

FOREIGN PATENT DOCUMENTS

| | | |
|---|---|---|
| 0305935A2 | 3/1989 | European Pat. Off. . |
| 0401410A1 | 12/1990 | European Pat. Off. . |

*Primary Examiner*—Jeffrey A. Gaffin
*Assistant Examiner*—Michael Sherry
*Attorney, Agent, or Firm*—Skjerven, Morrill, MacPherson, Franklin & Friel; David E. Steuber

[57] ABSTRACT

A protective circuit intended to protect a load against excessive input voltage includes a depletion mode MOSFET, i.e., a MOSFET which is conductive when its $V_{gs}=0$. Various alternative embodiments are described including those where the gate of the depletion mode MOSFET is tied to its source or to ground or some other reference voltage, where the gate of the MOSFET is switched at the onset of an excessive voltage condition, and where the gate of the MOSFET is controlled by negative feedback. The protective protecting IC loads in automobile form a condition known as load dump.

31 Claims, 11 Drawing Sheets

PROTECTIVE CIRCUIT FOR PROTECTING LOAD AGAINST EXCESSIVE INPUT VOLTAGE

CROSS REFERENCE TO RELATED APPLICATION

This application is related to Application Ser. No. 08/326,172, entitled "Electrostatic Discharge Protection Device For Integrated Circuit", filed concurrently herewith, which is incorporated herein by reference in its entirety.

FIELD OF THE INVENTION

This invention relates to circuitry for protecting a load, particularly a load containing semiconductor devices, from excessive or reversed voltages. In particular, this invention relates to circuitry for protecting a load from a condition sometimes referred to as "load dump", which occurs in automobiles.

BACKGROUND OF THE INVENTION

Semiconductor devices, particularly those contained in integrated circuits, can be severely damaged if they are exposed to a "reversed voltage" such as occurs, for example, when a negative voltage is applied to a terminal which is designed to receive a positive voltage. This can occur in an automobile when the battery is inadvertently connected with its terminals reversed. In the presence of a reversed voltage condition, PN junctions within a semiconductor device may become forward biased, resulting in large currents, overheating, melting of aluminum traces and permanent damage to the device.

At low power levels, this problem can be overcome by connecting a Schottky diode in series with the load, as shown in FIGS. 1A and 1B. Diode 10 represents a PN junction within module 11. When the battery is reversed (FIG. 1B), threatening to forward bias diode 10, Schottky diode 12 becomes reverse-biased and prevents the current from flowing, thereby protecting the module 11. When the battery is properly connected (FIG. 1A), Schottky diode 12 is forward biased and dissipates a small amount of power.

At higher power levels, a power MOSFET and special control circuit can be used to provide protection against a reversed battery, as described in U.S. application Ser. No. 08/067,373, which is incorporated herein by reference. While from a technical standpoint this is an attractive solution to the problem, the inclusion of a power MOSFET in the circuit represents an added cost.

The possibility of excessive battery voltages represents a more difficult problem. While excessive voltage may occur in a variety of circumstances, two situations are particularly noteworthy in automobiles. First, during the jump-starting of an automobile, the voltage may increase to a voltage which is approximately double the normal battery voltage (i.e., 24 V). A 24 V potential poses difficulties because many of the ICs connected to the battery, including regulator ICs, have an operating range of from 6 V to 18 V. In the presence of 24 V, some of the junctions 30 in the IC may go into avalanche breakdown. This could damage the IC if it is not capable of withstanding the current and energy generated by the avalanche breakdown.

A more difficult problem is presented by the condition referred to as "load dump" which is illustrated in FIGS. 2A–2C. Load dump typically occurs when the generator, running at full current to charge the battery, is momentarily disconnected from the battery post by a mechanical vibration or shock. The resulting open circuit, represented by switch 20 in FIG. 2A, causes a rapid decrease in the current flowing through various inductances in the circuitry, represented as 21 and 22. Of course, the generator itself also includes inductive elements. According to the well known relationship V=L dI/dt, very high voltages, on the order of hundreds of volts, can be created in this way. Such voltages would destroy most ICs.

To ameliorate this problem, a zener diode 23, frequently known as a transorb, is connected in parallel with the load, which is designated as 24 in FIG. 2A. Zener diode 23 is normally used to clamp the voltage to 30 volts or so. In practice, however, it takes tens of nanoseconds for zener diode 23 to fire, during which time the voltage on the supply line may soar to between 50 V and 100 V. Moreover, a large distance between the zener diode and the load could diminish the diode's ability to clamp the excessive voltage caused by the load dump.

As a result, load dump is properly considered as a transient 50 to 100 V condition present on the battery line of the automobile. This condition may persist for several hundred milliseconds. Since the die, package and surroundings of a semiconductor component can reach thermal equilibrium within about 100 milliseconds, load dump must be considered as a quasi-DC 50 V to 100 V supply line condition.

In FIG. 2A, $V_{batt}'$ designates the voltage across the battery 25 and $V_{batt}$ represents the voltage on the battery line throughout the automobile. In FIG. 2B is shown the behavior of $V_{batt}'$ and $V_{batt}$ with the generator open-circuited at a time t=0. As shown, $V_{batt}'$ increases sharply to about 60 volts and then levels off as zener diode 23 breaks down. FIG. 2C shows the behavior of the current through the generator ($I_{gen}$) and the current through zener diode 23 ($I_{diode}$) before and after the open circuit condition occurs.

As shown in FIG. 3A, a series resistance 30 and a second zener diode 31 are commonly used to limit the maximum voltage in the module (or integrated circuit). As shown in FIG. 3B, the voltage across the load 24 is limited to $BV_z$, the breakdown voltage of zener diode 31, and as shown in FIG. 3C, the current $I_{DD}$ through the module is limited to ($60-BV_z$)/$R_{series}$, where $R_{series}$ represents the resistance of resistor 30.

An alternative approach uses a PNP transistor in place of the resistor, as shown in FIG. 4A. Bipolar transistor 40 acts as a current source, with its base supplied by a current supply 41. If the current supplied by current supply 41 is maintained at a low level, the collector current of bipolar transistor 40 also is limited, and transistor 40 sustains most of the voltage created by the load dump. As shown in FIG. 4B, the voltage $V_{DD}$ across the load remains constant while the collector-to-emitter voltage $V_{ce}$ of transistor 40 increases to a level equal to the breakdown voltage of zener diode 23 minus $V_{DD}$ when the load dump occurs. As shown in FIG. 4C, the base current $I_B$ and collector current $I_c$ in transistor 40 remain constant.

The problem with the current-limiting resistor approach (FIG. 3A), is that, during a light load condition, $V_{DD}$ gets greater (i.e., the voltage drop across resistor 30 gets smaller). Zener diode 31 may then break down and carry essentially the entire current passing through resistor 30. It can be shown that, in this situation, the power losses are proportional to $V_{batt}^2$. For an 18 V fully charged battery, these losses are substantial. This in effect limits the resistive approach to low current loads where resistor 30 can be made large.

If $BV_z$ is chosen above the normal operating range for the battery to avoid power dissipation within the IC during normal operation, series resistance in zener diode 30 may cause it to climb to an unacceptably high voltage during load dump. The higher $BV_z$, the higher the resistance of zener diode 30 during breakdown.

Another problem with this approach is that it allows the current to rise in proportion to the battery voltage. Thus, at a battery voltage of 60 V, the current may be six times higher than normal. Even with a constant voltage on zener diode 31, power dissipation in the IC increases by the same amount, and the power dissipated in resistor 30 increases by a factor of 36. This prevents integration of resistor 30 into the IC and requires the use of an expensive, wire-wound power resistor.

The alternative approach using a PNP linear regulator (FIG. 4A) is the technique most commonly used in the automotive industry. However, this approach is unattractive for a number of reasons. Linear regulators can be very inefficient if the input voltage and the output voltage differ greatly. High-voltage PNP bipolar transistors have a low current gain, and this makes the base current a significant source of power loss. The power delivered to the load is limited by the collector-emitter voltage of the bipolar transistor at saturation, which is generally greater than 0.3 V even at low current. Since long wires between the regulator and the load are unacceptable, each load must have its own regulator, adding to the cost. The thermal protection of the bipolar transistor is difficult because of its inherent characteristic of conducting more current at higher temperatures.

The base drive requirements of the bipolar transistor can be a significant problem. Given a $\beta$ of 10, for example, a 2 A regulator requires 200 mA of base current. The drive losses result from supplying this entire current from the battery voltage (the losses are split between the bipolar base-to-emitter junction and the current sinking device tied to ground, shown as current source 41 in FIG. 4A). The total power loss in the bipolar transistor is the sum of the base drive loss plus the $I_c \times V_{ce}$ loss, or $$P_{loss} = (I_b \times V_{batt}) + I_c (V_{batt} - V_{DD})$$

$$\approx I_c[(1+1/\beta)V_{batt} - V_{DD}]$$

For a 2 A load and a 5 V output, the power dissipation at an 18 V high battery condition is nearly 30 watts, with 3.6 watts lost in the base drive alone. When the output is only 6 V, the $I_c \times V_{ce}$ losses are reduced to 2 watts, but the drive loss is 200 mA×6 V or 1.2 watts. Thus, over 50% of the losses are associated with the base drive.

Even if the load is limited to a low current, the power dissipated during a load dump condition is still very high. Moreover, beyond the undesirable power loss in the base of the bipolar transistor, the transistor must be designed with a voltage rating such that the $BV_{ceo}$ or sustaining voltage of the bipolar transistor exceeds the maximum rating. For example, a 100 V product may need a BVcbo junction breakdown of 170 V. An additional safety margin must be provided for high temperature operation. The sustaining voltage problem is one reason that the $\beta$ is so low. In other words, the base drive losses of the bipolar transistor cannot be reduced without sacrificing the high temperature robustness of the device.

SUMMARY OF THE INVENTION

In accordance with this invention protection against load dump is accomplished by connecting a depletion mode MOSFET in series with the load that is to be protected. A depletion mode MOSFET is a MOSFET which is conductive when the gate-to-source voltage $V_{gs}$ is equal to zero and becomes nonconductive when $V_{gs}$ reaches the pinch-off voltage, which for an N-channel device is a negative voltage (i.e., the gate is biased below the source). (For a P-channel MOSFET, pinch-off is achieved by raising the gate voltage above the source voltage.)

In a first group of embodiments, the gate of the depletion mode MOSFET is tied either to the source of the MOSFET or to ground or to a reference voltage somewhere between the source voltage and ground. In a final embodiment in this group, the gate of the MOSFET is tied to the cathode of a zener diode that is connected between the source of the MOSFET and ground.

In a second group of embodiments, the gate of the depletion mode MOSFET is switched from a first level to a second level when the voltage at the source of the MOSFET reaches a predetermined level. The predetermined level is set with regard to the source voltage during a load dump condition. This group of embodiments has the advantage that the current through the depletion mode MOSFET is generally reduced during a load dump.

In a third group of embodiments, negative feedback is used to control the gate voltage of the depletion mode MOSFET.

DESCRIPTION OF THE INVENTION

The embodiments according to this invention include a depletion mode MOSFET connected in series with the load that is to be protected.

Figure 5A:
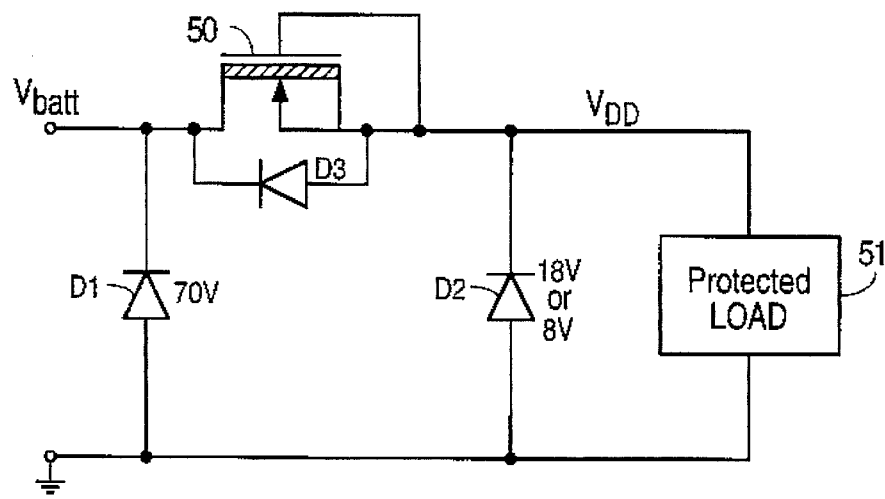
FIG. 5A illustrates a protective device in accordance with the invention in which the source of the depletion mode MOSFET is tied to the gate of the depletion mode MOSFET.

FIG. 5A illustrates the basic circuit which includes a MOSFET 50 that is connected in series with a load 51. A diode D1 connected between the drain of MOSFET 50 and ground has a relatively high breakdown voltage of, for example, 70 V. A second diode D2 connected between the source of MOSFET 50 and ground (in parallel with load 51) typically has a lower breakdown voltage which may be, for example, 8 V (for a 5 V circuit) or 18 V (for a 15 V circuit). Diodes D1 and D2 are not absolutely necessary to the circuit but they are beneficial in some ways. In integrated implementations, diodes D1 and D2 may be unavoidably present. Diode D1 may be associated with the drain-to-substrate junction of an integrated version of a DMOS transistor while diode D2 may be present in a CMOS transistor pair or in an electrostatic discharge (ESD) protection structure. If present, diode D1 must have an avalanche breakdown value in excess of the load dump voltage to prevent unwanted conduction during the load dump transient. Conduction during load dump would most likely destroy diode D1.

Typically, the pinch-off voltage $V_p$ of depletion mode MOSFET 50 will fall somewhere in the range of −1 V to −4 V. In normal operation, diode D2 is not in breakdown and, assuming that $V_p$ and the device size of MOSFET 50 have been properly chosen, MOSFET 50 will behave as a resistor. When a load dump occurs, the voltage at the source of MOSFET 50 will rise to the breakdown voltage of diode D2. If the input voltage then continues to increase, MOSFET 50 will support the incremental voltage, saturate and begin to current limit. Once MOSFET 50 is in the current-limiting mode, additional power can be dissipated in MOSFET 50 only by increases in voltage. Thus, the power dissipated in a saturated MOSFET 50 is a linear function of the input voltage.

Figure 5B:
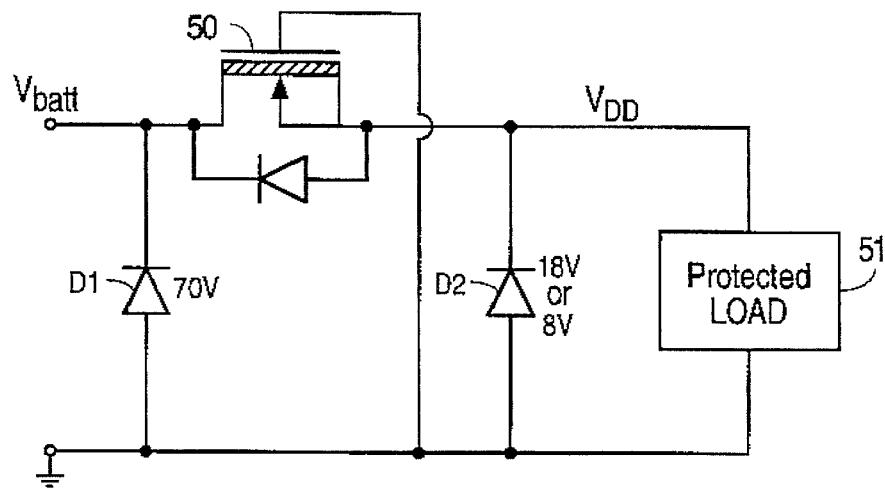
FIG. 5B illustrates a protective device according to the invention in which the gate of the depletion mode MOSFET is tied to ground.

In the embodiment shown in FIG. 5B, the gate of MOSFET 50 is tied to ground. In this embodiment, $V_p$ of MOSFET 50 may be, for example, −8 V to allow $V_{DD}$ to rise to 8 V. The circuit shown in FIG. 5B naturally limits the value of $V_{DD}$ to a value near the pinch-off voltage (i.e., $-V_p$), unless too much load current is demanded for the size of depletion mode MOSFET 50.

Figure 5C:
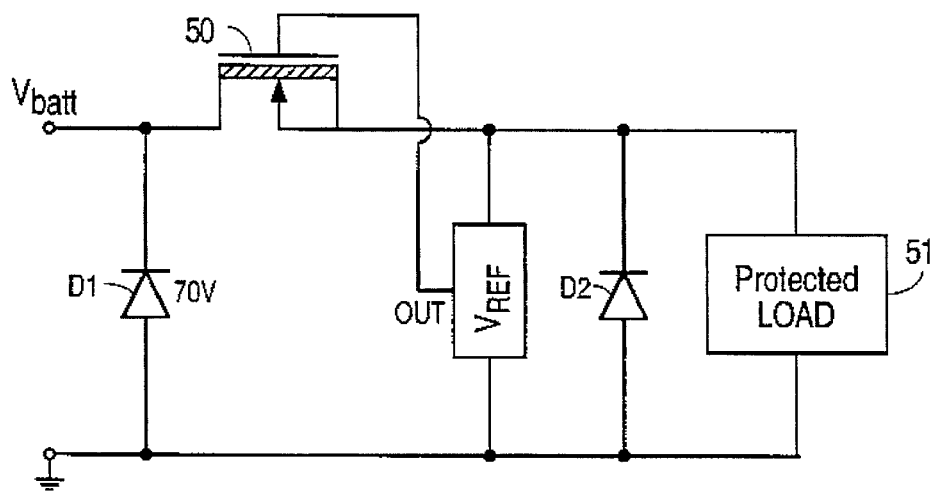
FIG. 5C illustrates a protective device according to the invention in which the gate of the depletion mode MOSFET is tied to a reference voltage between the source voltage and ground.
Figure 5D:
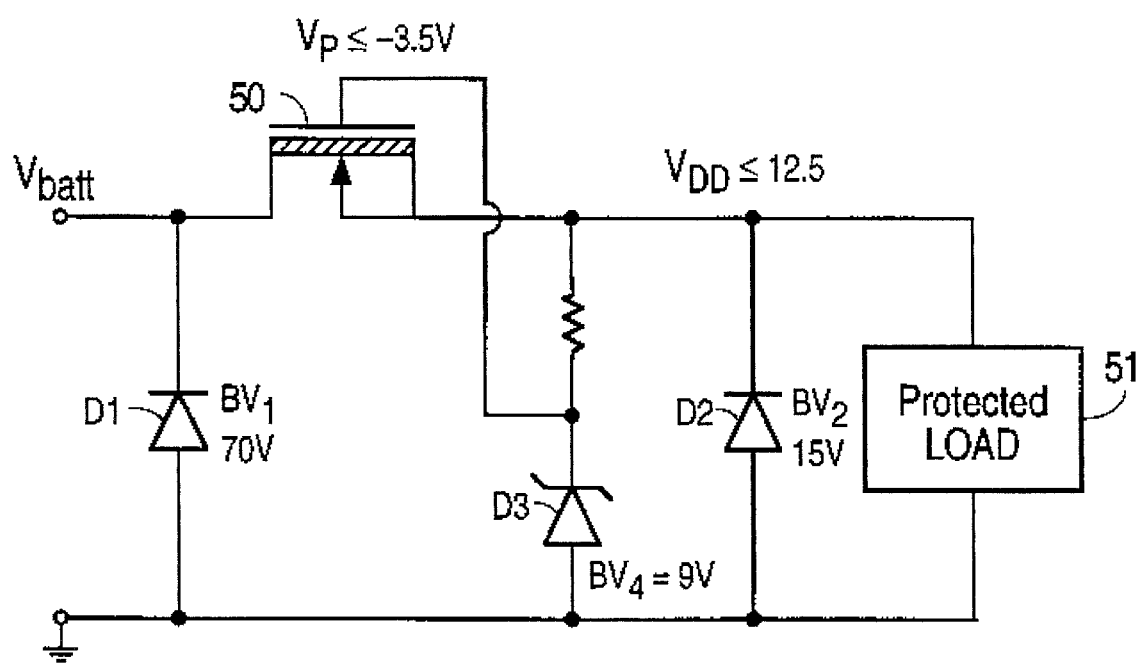
FIG. 5D illustrates a protective device in accordance with the invention in which the gate of the depletion mode MOSFET is connected to the cathode of a zener diode connected between ground and the source of the depletion mode MOSFET.

Alternatively, the gate of MOSFET 50 may be tied to a reference voltage between ground and the source voltage of MOSFET 50, as shown in FIG. 5C, or to the cathode of a zener diode D3 as shown in FIG. 5D. In the embodiment of FIG. 5D, the voltage $V_{DD}$ is effectively limited to a maximum which is equal to the sum of the breakdown voltage of zener diode D3 and the absolute value of the pinch-off voltage of MOSFET 50.

Determination of the best threshold for depletion mode MOSFET 50 depends on the device sizing and required range of load currents. Given a depletion mode MOSFET 50 having a threshold voltage $V_t = -V_p$, the saturation current is given by the following equation.

$$I_d \text{ (sat)} = kV_p^2$$

where $k = \mu C_{ox} W/L$, where $\mu$ is the carrier mobility of the MOSFET, Cox is the gate capacitance, W is the gate width, and L is the channel length. Likewise, the on-resistance of MOSFET 50 is equal to $$R_{ds} = \frac{1}{kV_p}$$

During normal operation, where the current is not too large, MOSFET 50 operates in its linear region acting like a series resistor having a resistance $R_{ds}$. The voltage drop across MOSFET 50 is simply:

$$V_{normal} = I_{normal} R_{ds}$$
$$= \frac{I_{normal}}{kV_p}$$

During a load dump, MOSFET 50 current saturates, becoming a constant current source. The current through load 51 does not increase in proportion to the load dump voltage. The increase in the saturation current as compared with the normal current is described as follows:

$$\frac{I_d \text{ (sat)}}{I_{normal}} = \frac{kV_p^2}{kV_p V_{normal}}$$
$$= \frac{V_p}{V_{normal}}$$

This means in effect that, with the depletion mode device, the percentage increase in current during a load dump can be minimized by running the depletion mode device during normal operation at a higher current density. Thus, in the circuits shown in FIGS. 5A–5D, there is a tradeoff between the power loss in MOSFET 50 during normal operation and the increase in current through MOSFET 50 during a load dump condition.

Figure 1A:
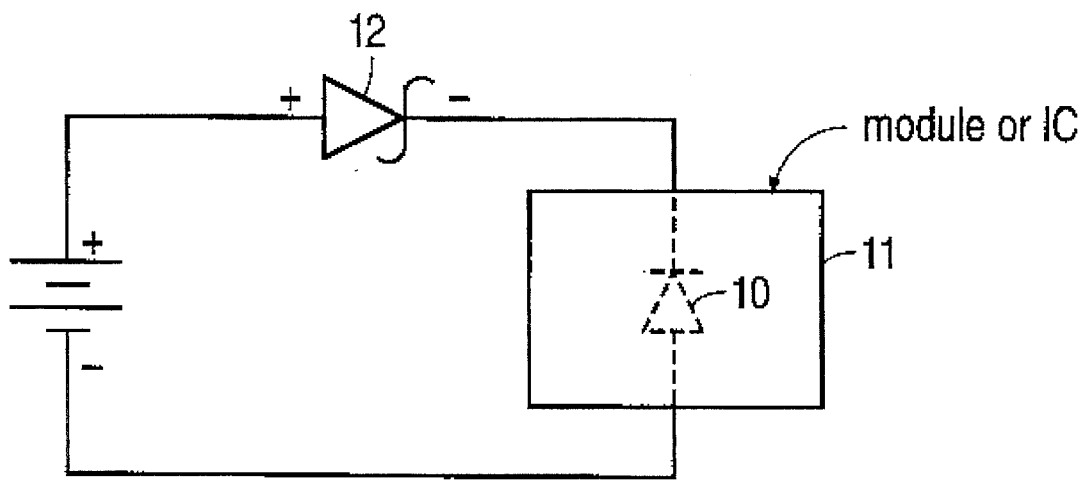
FIGS. 1A and 1B illustrate a conventional battery reversal protection circuit including a Schottky diode.
Figure 1B:
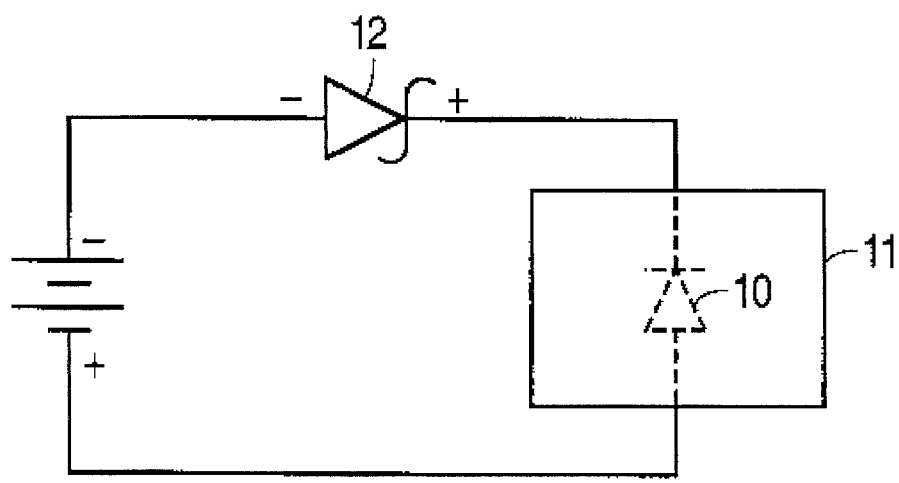
Figure 2A:
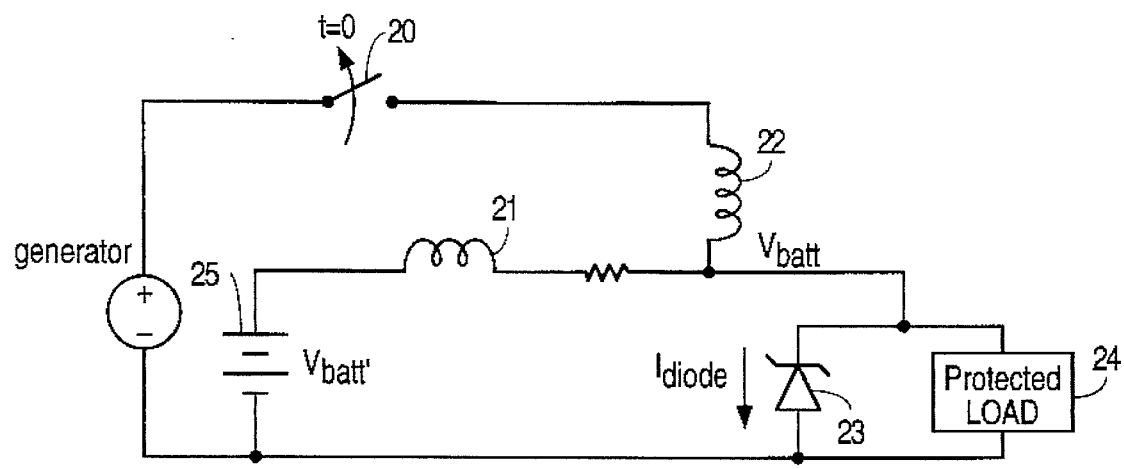
FIG. 2A is a circuit diagram which illustrates schematically what happens during a load dump.
Figure 2B:
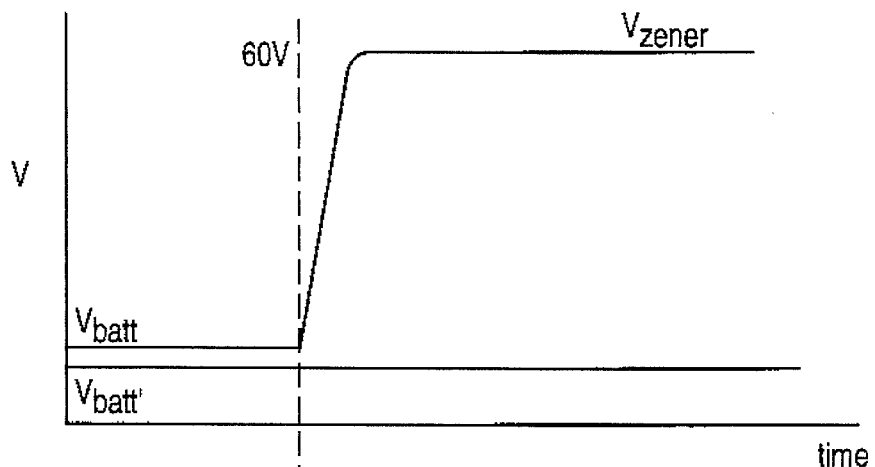
FIG. 2B is a graph which illustrates the voltage across the load before and during a load dump in the circuit of FIG. 2A.
Figure 2C:
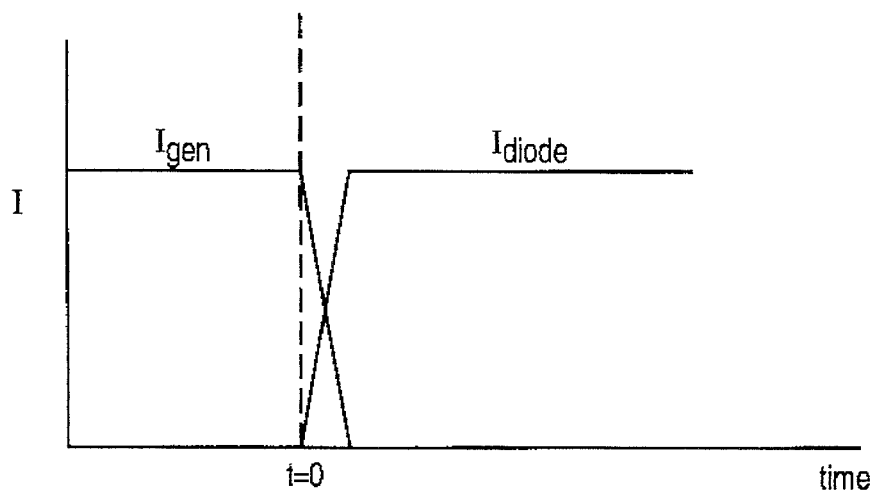
FIG. 2C is a graph which illustrates the current through the generator and the protective zener diode before and during a load dump in the circuit of FIG. 2A.
Figure 3A:
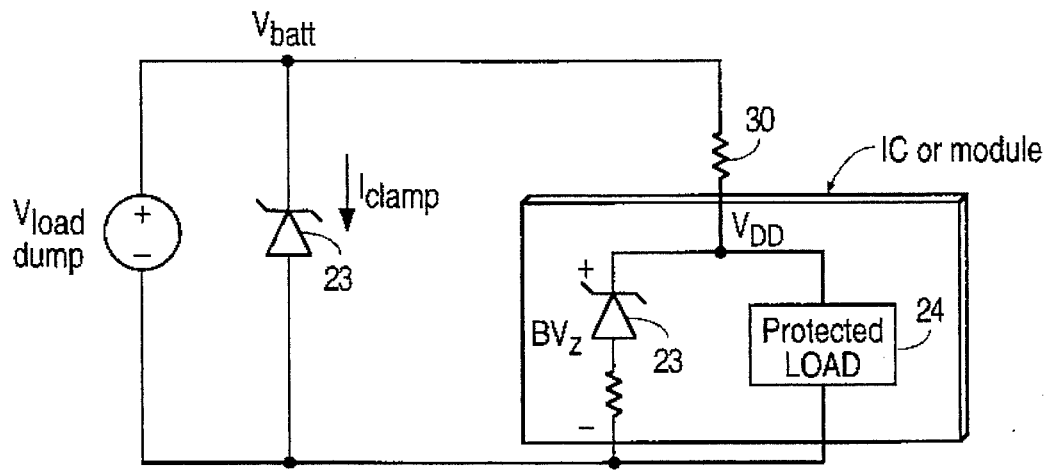
FIG. 3A illustrates a conventional load dump protection circuit which includes a series resistor and a zener diode voltage clamp.
Figure 3B:
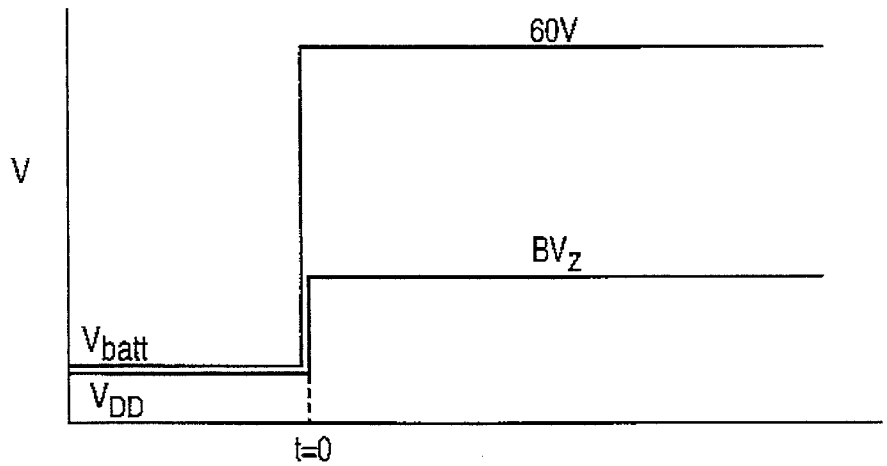
FIG. 3B is a graph which illustrates the behavior of the voltage across the load before and during a load dump in the circuit of FIG. 3A.
Figure 3C:
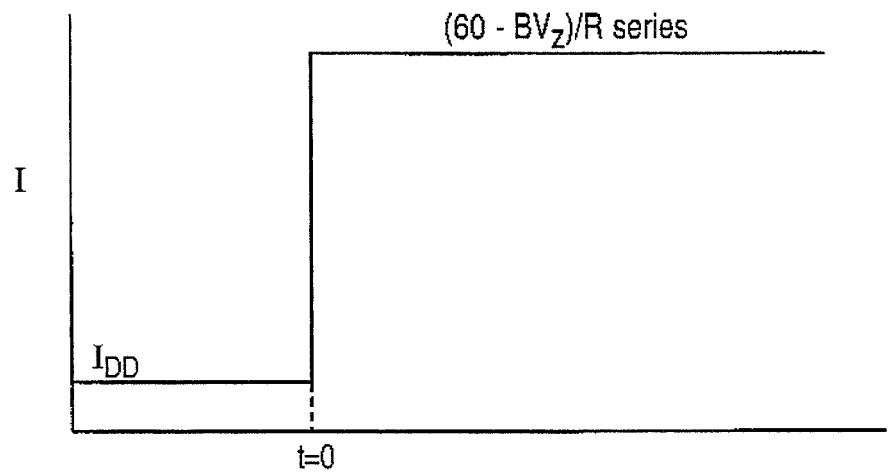
FIG. 3C is a graph which illustrates the current through the zener diode voltage clamp before and during a load dump in the circuit of FIG. 3A.
Figure 4A:
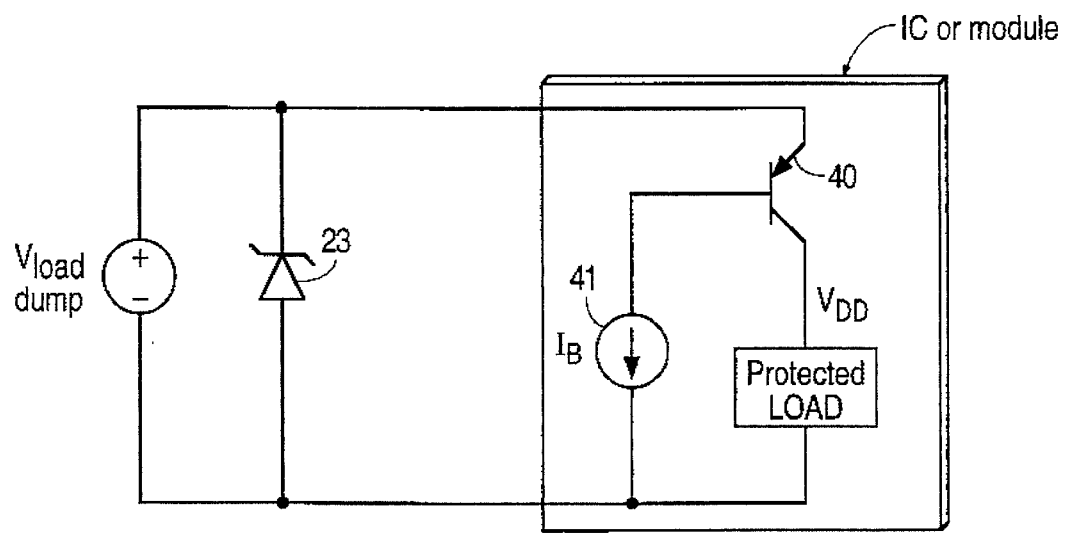
FIG. 4A illustrates a circuit diagram of a conventional load dump protective circuit which includes a bipolar transistor.
Figure 4B:
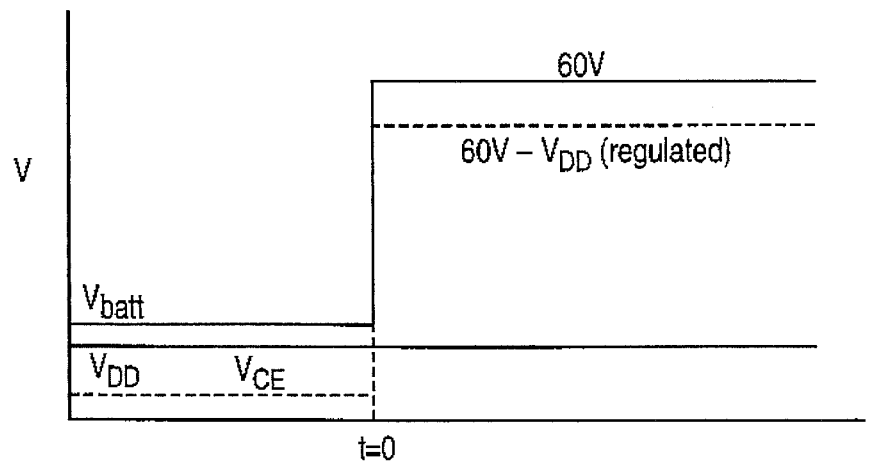
FIG. 4B is a graph which illustrates the voltage across the load before and during a load dump in the circuit of FIG. 4A.
Figure 4C:
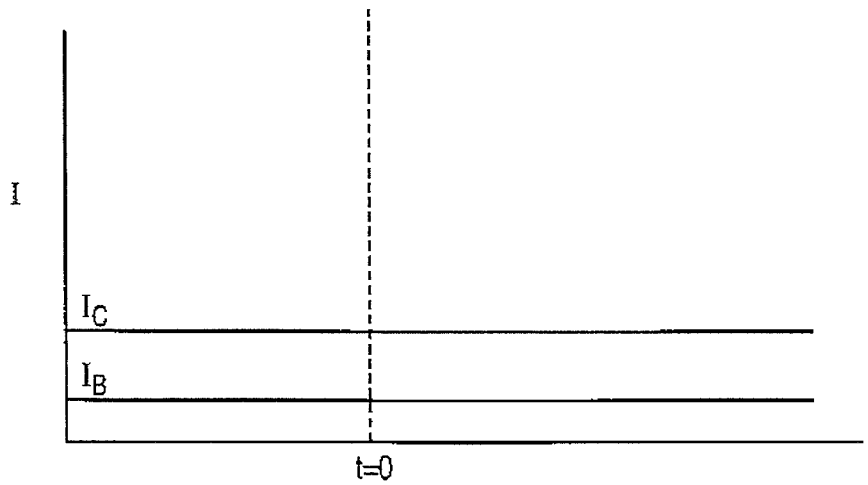
FIG. 4C is a graph which illustrates the current through the load before and during a load dump in the circuit of FIG. 4A.
Figure 6A:
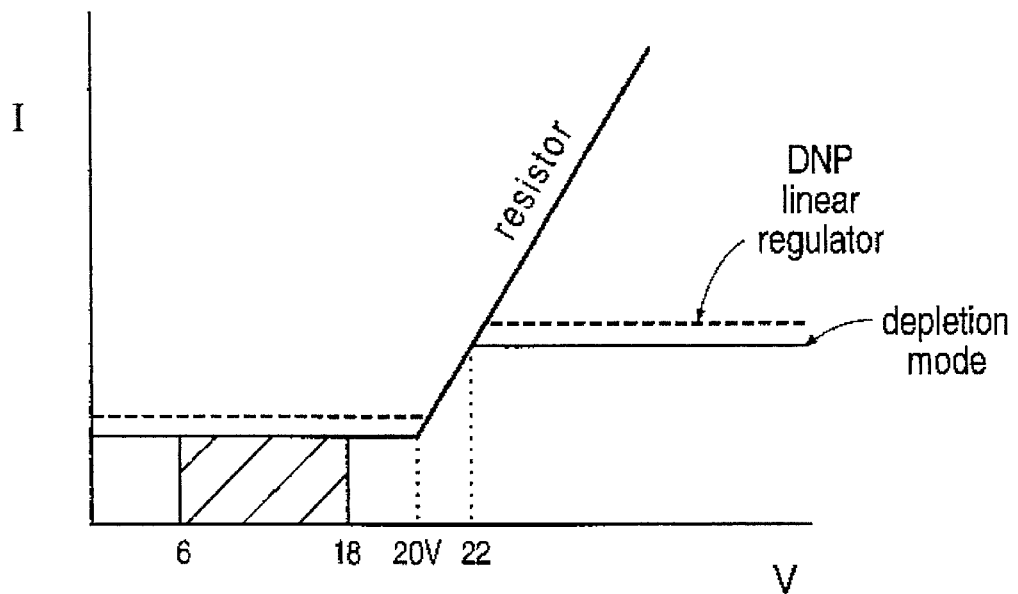
FIG. 6A is a graph which illustrates the behavior of the current through the depletion mode MOSFET in the embodiments of FIGS. 5A–5D as the voltage is increased, and compares this current with the currents in the circuits shown in FIGS. 3A and 4A.

FIG. 6A illustrates the behavior of current as a function of voltage for the resistive approach (FIG. 3A), the bipolar transistor approach (FIG. 4A) and the depletion MOSFET approach shown in FIGS. 5A–5D. In all three cases, the current does not increase until after the battery voltage exceeds the breakdown voltage of diode D2, i.e., 20 V. Assuming that MOSFET 50 and resistor 30 are selected to offer the same linear resistance, the current then rises linearly until MOSFET 50 saturates and limits the current. The current through resistor 30 continues to increase linearly. The PNP transistor 40 behaves somewhat like MOSFET 30 except that the presence of a base current increases the total current through the device.

Figure 6B:
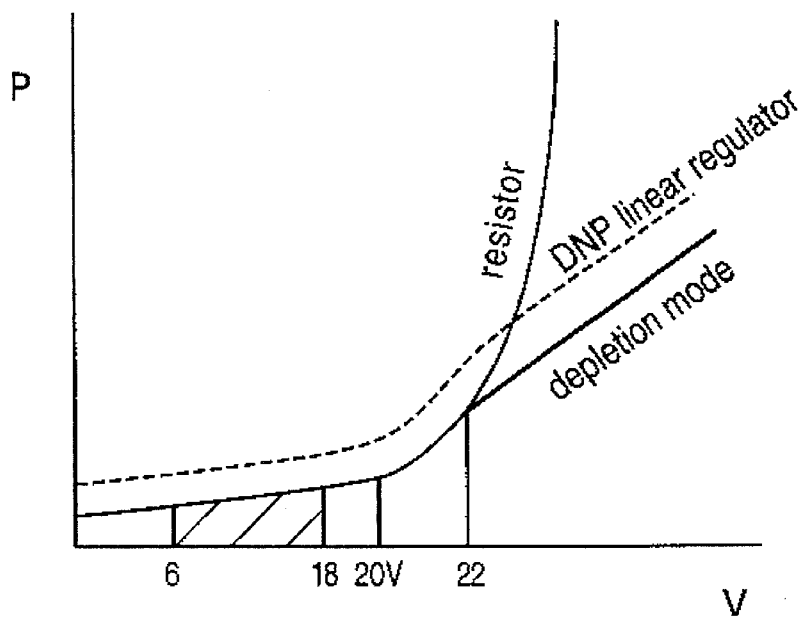
FIG. 6B is a graph which illustrates the power consumed in the depletion mode MOSFET in the embodiments shown in FIGS. 5A–5D as the voltage is increased, and compares this power with the power consumed in the circuits shown in FIGS. 3A and 4A.

FIG. 6B illustrates power loss as a function of voltage for the same devices. The power losses in all three devices increase linearly until the breakdown of the zener diode, although the power losses in bipolar transistor 40 are somewhat greater. The power losses then begin to increase geometrically (by a square law). When bipolar transistor 30 and MOSFET 50 current saturate, the power losses again begin to increase linearly while the power losses through resistor 30 continue to increase geometrically.

Figure 7A:
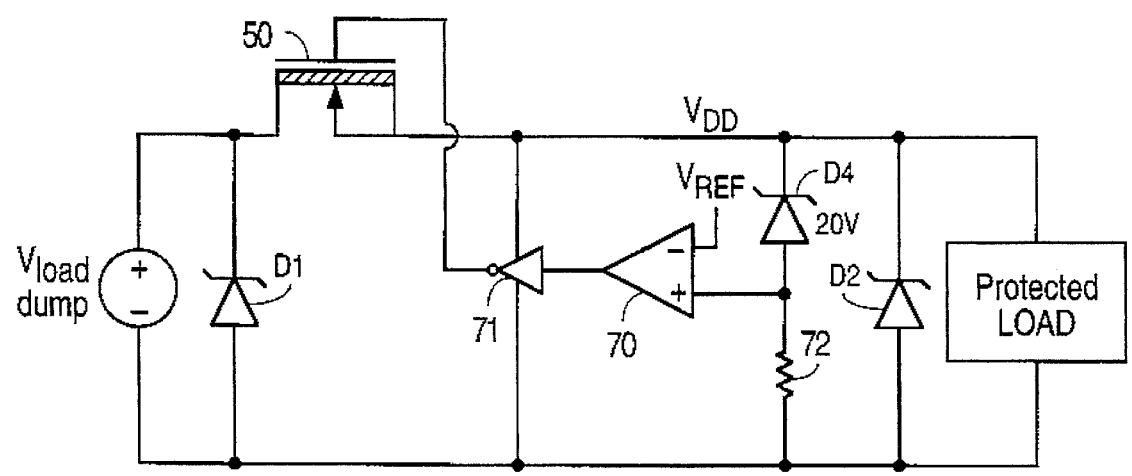
FIG. 7A illustrates an alternative protective device in accordance with the invention in which the gate of the depletion mode MOSFET is switched from the source voltage to ground during a load dump condition.
Figure 7B:
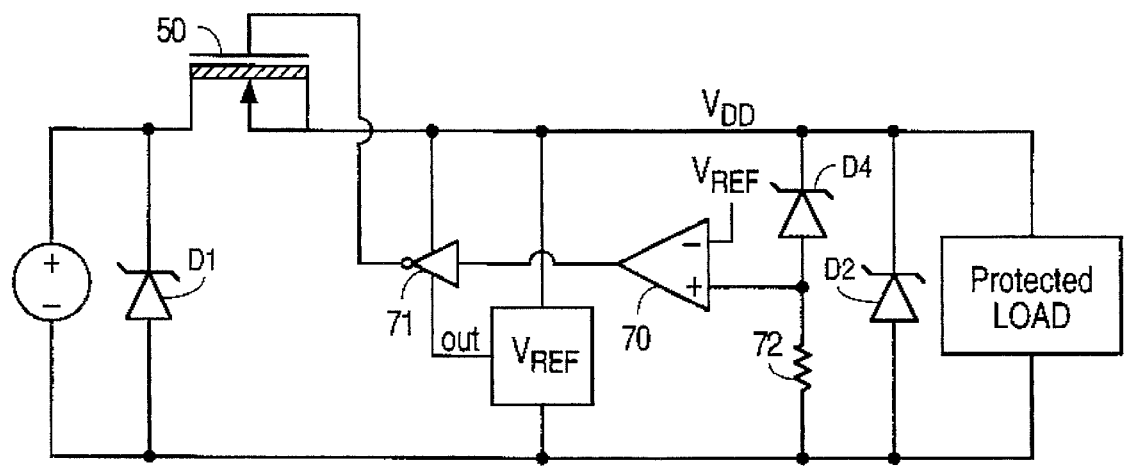
FIG. 7B illustrates an alternative protective device in accordance with the invention in which the gate of the depletion mode MOSFET is switched from the source voltage to a reference voltage during a load dump condition.

FIGS. 7A and 7B illustrate improved embodiments in which the gate of MOSFET 50 is switched when a load dump occurs. The circuit of FIG. 7A includes a comparator 70 having a negative input terminal connected to a reference voltage $V_{ref}$ and a positive input connected to the anode of a zener diode D4. The output of comparator 70 is connected to an inverter 71 whose output is connected to the gate of MOSFET 50.

When $V_{DD}$ is below the breakdown voltage of zener diode D4, the positive input of comparator 70 is grounded, and inverter 71 outputs a voltage equal to $V_{DD}$ to the gate of MOSFET 50. In this situation the circuit is equivalent to the circuit shown in FIG. 5A, with the source and gate of MOSFET 50 shorted together.

During a load dump, $V_{DD}$ increases, breaking down zener diode D4 which forms a voltage divider with a resistor 72. The positive input of comparator 70 rises above $V_{ref}$ and comparator 70 outputs a voltage which causes inverter 71 to apply ground potential to the gate of MOSFET 50.

In this situation, the saturation current of MOSFET 50 is reduced to the following level:

$$I_d(sat)=k(V_p-BV_{zener})^2$$

where $BV_{zener}$ is the breakdown voltage of zener diode D4. If it is desired not to have zener diode D2 breakdown at a high battery voltage of 18 V, zener diode D4 could have a breakdown voltage of 15 V.

Alternatively, the gate of MOSFET 50 may be switched to an intermediate bias during load dump, using the circuit shown in FIG. 7B. With this circuit, inverter 71 applies a predetermined reference voltage $V_{REF}$ to the gate of MOSFET 50 during a load dump. The following equation expresses the $V_{gs}$ of depletion mode MOSFET 50 as a function of a desired maximum current $I_{max}$ during a load dump condition:

$$V_{gs} = V_{REF} - V_{DD} = -(|V_p| - \sqrt{I_{max}/K}\ )$$

Figure 8A:
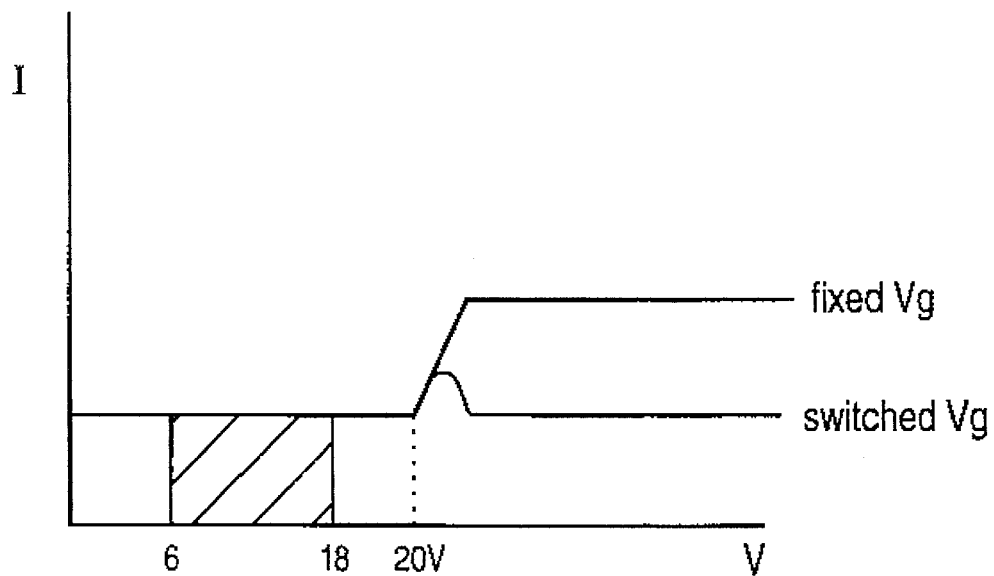
FIG. 8A is a graph which compares the current through the MOSFET as a function of voltage in switched and unswitched embodiments of the invention.
Figure 8B:
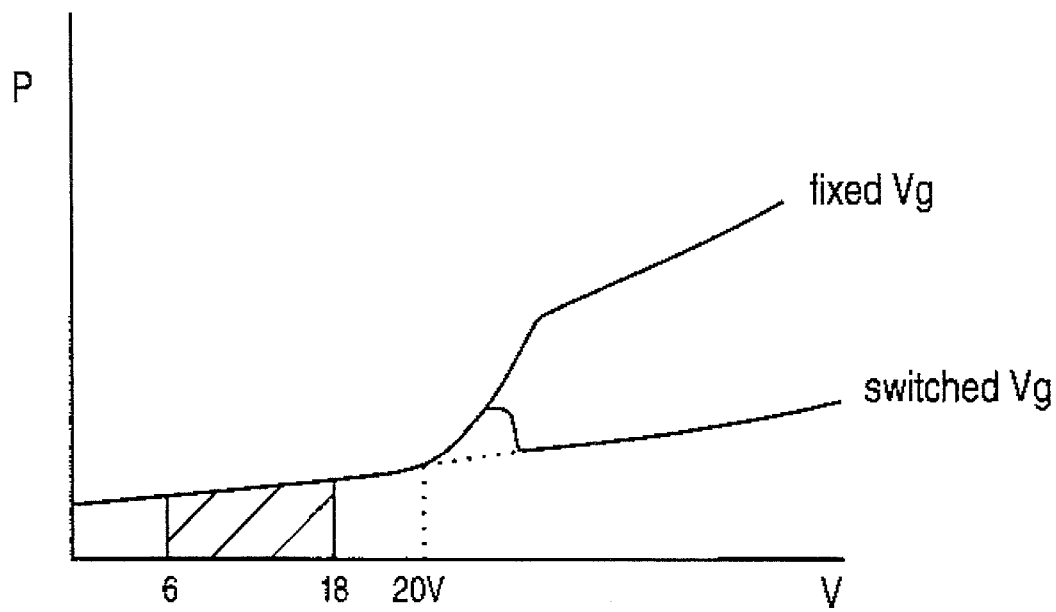
FIG. 8B is a graph which compares the power consumed in the MOSFET as a function of voltage in switched and unswitched embodiments of the invention.

FIGS. 8A and 8B show the current through and power dissipated by MOSFET 50 with increasing voltage when the gate is fixed (FIGS. 5A–5D) and switched (FIGS. 7A and 7B). The bump which is shown in the curves for the switched gate occurs because it takes time for the switching to occur. As an alternative to the circuitry shown in FIGS. 7A and 7B, the voltage detection may be performed on the drain side of depletion mode MOSFET 50, although in this case the detection circuitry must be able to survive a load dump.

Figure 9:
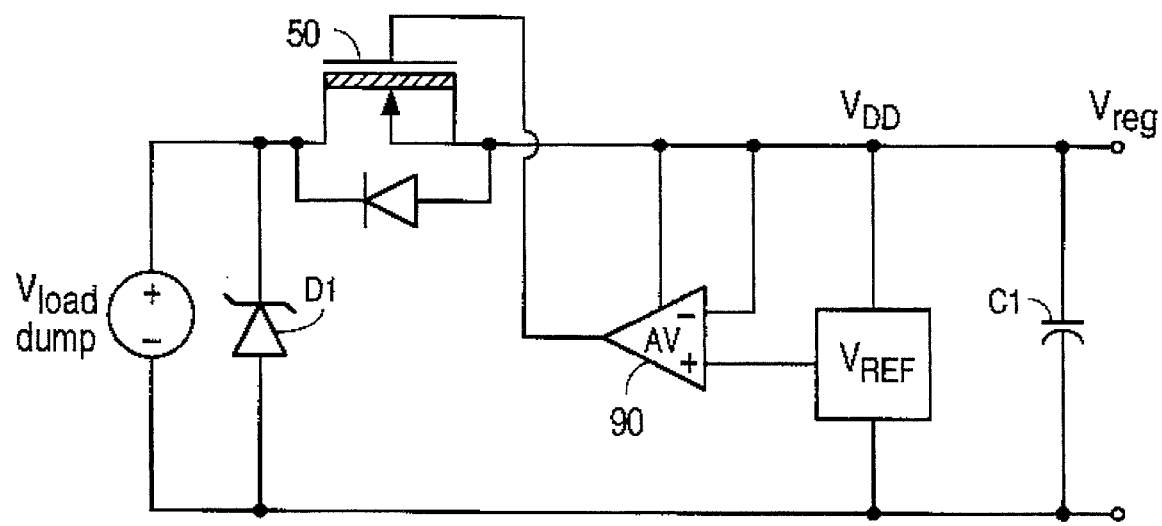
FIG. 9 illustrates an alternative protective device in which the gate voltage of the depletion mode MOSFET is controlled by negative feedback.

In FIG. 9, a differential amplifier 90 applies a negative feedback voltage to the gate of MOSFET 50 so as to limit increases in $V_{DD}$. The positive input of differential amplifier 90 is connected to a reference voltage $V_{REF}$ and the negative input of amplifier 90 is connected to $V_{DD}$. A capacitor C1 provides filtering to prevent the circuit from oscillating. During a load dump, differential amplifier 90 applies a negative voltage to the gate of MOSFET 50, thereby reducing the current flow through MOSFET 50 and limiting increases in $V_{DD}$. Since the gate drive for depletion mode MOSFET 50 does not exceed the voltage on the positive power supply rail, no charge pump is needed to drive this device. Moreover, MOSFET 50 is normally on and is therefore capable of supplying start up current before the control circuitry driving its gate is activated during the initial application of power.

Figure 10A:
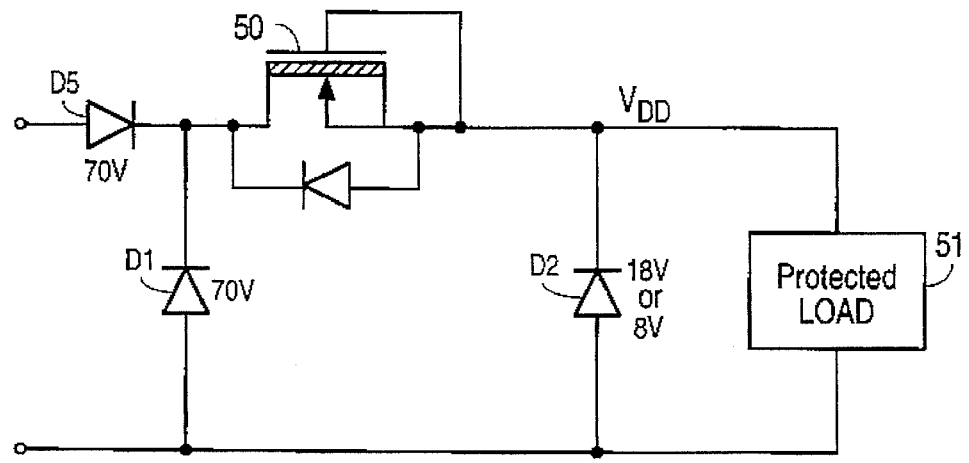
FIGS. 10A–10C illustrate a protective device which also protects against a reversed input voltage.
Figure 10B:
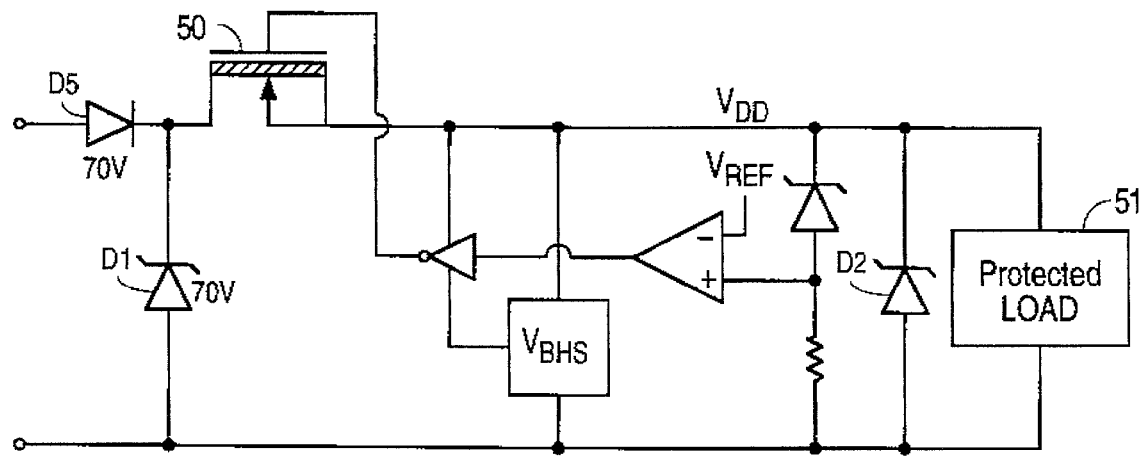
Figure 10C:
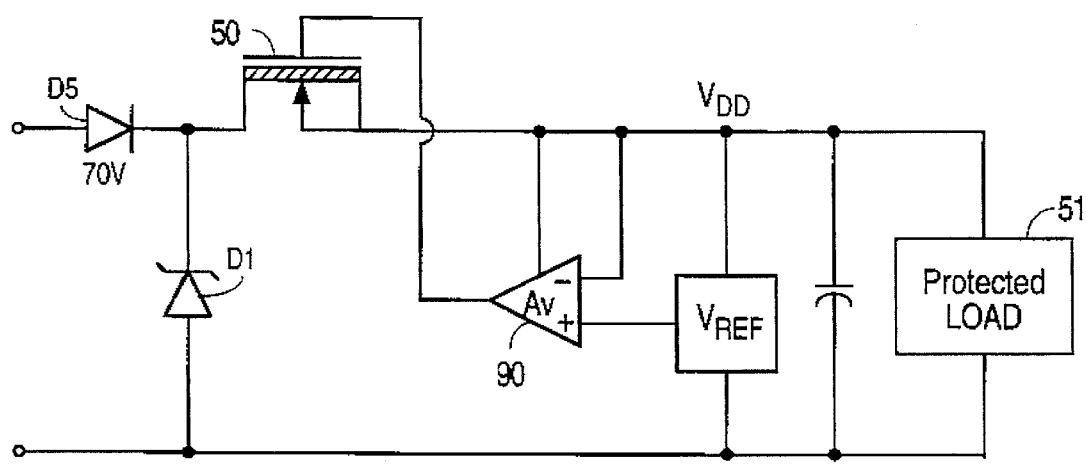

The load dump protective circuitry of this invention may be combined with a device to protect the circuit elements against a reversed battery connection. In FIGS. 10A–10C a diode D5 has been added to the circuit, with its anode connected to $V_{batt}$ and its cathode connected to the drain of MOSFET 50. The basic load dump circuitry in FIG. 10A corresponds to the circuit shown in FIG. 5A, the circuit shown in FIG. 10B corresponds to the circuit shown in FIG. 7B and the circuit shown in FIG. 10C corresponds to the circuit shown in FIG. 9. Absent diode D5, a reversed battery condition could cause excessive current in diode D1.

While specific embodiments according to this invention have been described, it will be appreciated that the broad principles of this invention may be embodied in numerous additional arrangements and configurations. For example, while the embodiments described include an N-channel MOSFET that is connected to the positive side of the load, the polarities could be reversed and a P-channel MOSFET could also be used. This invention, as defined in the following claims, is intended to cover all such additional arrangements and configurations.

I claim:

1. An arrangement including a source of an input voltage and a load to be protected from excessive current, said arrangement further including a protective circuit connected between said source and said load, said protective circuit comprising a depletion mode MOSFET, a drain of said depletion mode MOSFET being coupled to an input of said protective circuit and a source of said depletion mode MOSFET being coupled to an output of said protective circuit, a gate of said depletion mode MOSFET being permanently shorted to said source of said depletion mode MOSFET, said depletion mode MOSFET having a size and a pinch-off voltage such that said depletion mode MOSFET operates in a linear region when said input voltage is at a normal level and becomes saturated when said input voltage reaches an excessive level, said depletion mode MOSFET thereby protecting said load from said excessive current.

2. The arrangement of claim 1 further comprising a diode, said diode being connected to said source of said said depletion mode MOSFET such that said diode experiences breakdown when said input voltage reaches said excessive level.

3. The arrangement of claim 1 wherein said depletion mode MOSFET and said load are adapted such that said depletion mode MOSFET is operated near a saturation current of said depletion mode MOSFET when said input voltage is at a normal operating level.

4. The arrangement of claim 1 further comprising a diode connected in series with said depletion mode MOSFET, said diode being connected so as to block a reverse flow of current through said load.

5. The arrangement of claim 1 contained within a motor vehicle, said source of an input voltage comprising a generator and a battery, said load comprising a semiconductor component within said motor vehicle, said protective circuit functioning to protect said semiconductor component from a load dump or inductive voltage spike.

6. An arrangement including a source of an input voltage and a load to be protected from excessive current, said arrangement further including a protective circuit connected between said source and said load, said protective circuit comprising a depletion mode MOSFET, a drain of said depletion mode MOSFET being coupled to an input of said protective circuit and a source of said depletion mode MOSFET being coupled to an output of said protective circuit, a gate of said depletion mode MOSFET being connected to switching circuitry, said switching circuitry connecting said gate of said depletion mode MOSFET to ground when said input voltage reaches an excessive value such that said depletion mode MOSFET becomes saturated and thereby protects said load from said excessive current.

7. The arrangement of claim 5 further comprising a diode, said diode being connected to said source of said depletion mode MOSFET such that said diode experiences breakdown when said input voltage reaches said excessive level.

8. An arrangement including a source of an input voltage and a load to be protected from excessive current, said arrangement further including protective circuit connected between said source and said load, said protective circuit comprising a depletion mode MOSFET, a drain of said depletion mode MOSFET being coupled to an input: of said protective circuit and a source of said depletion mode MOSFET being coupled to an output of said protective circuit, a gate of said depletion mode MOSFET being permanently connected to ground, said depletion mode MOSFET having a size and a pinch-off voltage such that said depletion mode MOSFET operates in a linear region when said input voltage is at a normal level and becomes saturated when said input voltage reaches an excessive level, said depletion mode MOSFET thereby protecting said load from said excessive current.

9. The arrangement of claim 8 contained within a motor vehicle, said source of an input voltage comprising a generator and a battery, said load comprising a semiconductor component within said motor vehicle, said protective circuit functioning to protect said semiconductor component from a load dump or inductive voltage spike.

10. An arrangement including a source of an input voltage and a load to be protected from excessive current, said arrangement further including a protective circuit connected between said source and said load, said protective circuit comprising a depletion mode MOSFET, a drain of said depletion mode MOSFET being coupled to an input of said protective circuit and a source of said depletion mode MOSFET being coupled to an output of said protective circuit, a gate of said depletion mode MOSFET being permanently connected to a constant reference voltage at a level between a voltage at said source of said depletion mode MOSFET and ground, said depletion mode MOSFET having a size and a pinch-off voltage such that said depletion mode MOSFET operates in a linear region when said input voltage is at a normal level and becomes saturated when said input voltage reaches an excessive level, said depletion mode MOSFET thereby protecting said load from said excessive current.

11. The arrangement of claim 10 further comprising a diode, said diode being connected to said source of said depletion mode MOSFET such that said diode experiences breakdown when said input voltage reaches said excessive level.

12. The arrangement of claim 10 further comprising a zener diode and a resistor connected in series, said gate being connected to a common node between said zener diode and said resistor.

13. The arrangement of claim 10 contained within a motor vehicle, said source of an input voltage comprising a generator and a battery, said load comprising a semiconductor component within said motor vehicle, said protective circuit functioning to protect said semiconductor component from a load dump or inductive voltage spike.

14. An arrangement including a source of an input voltage and a load to be protected from excessive current, said arrangement further including a protective circuit connected between said source and said load, said protective circuit comprising a depletion mode MOSFET, a drain of said depletion mode MOSFET being coupled to an input of said protective circuit and a source of said depletion mode MOSFET being coupled to an output of said protective circuit, a gate of said depletion mode MOSFET being connected to switching circuitry, said switching circuitry connecting said gate to a first voltage so as to cause said depletion mode MOSFET to operate in a linear region when said input voltage is at a normal level, said switching circuitry connecting said gate to a second voltage so as to cause said depletion mode MOSFET to operate become saturated when said input voltage is at an excessive level, said depletion mode MOSFET thereby protecting said load from said excessive current.

15. The arrangement of claim 14 wherein said switching circuitry connects said gate of said depletion mode MOSFET to a voltage below a voltage at a source of said MOSFET when said input voltage reaches said excessive level.

16. The arrangement of claim 15 wherein said switching circuitry comprises a comparator, an input of said comparator being connected to a reference voltage, a signal at an output of said comparator being used to provide a voltage at said gate of said depletion mode MOSFET.

17. The arrangement of claim 16 wherein said gate of said depletion mode MOSFET is connected to ground when said input voltage reaches said excessive level.

18. The arrangement of claim 16 wherein said gate of said depletion mode MOSFET is connected to a second reference voltage when said input voltage reaches said excessive level, said second reference voltage being at a level between a voltage at said source of said depletion mode MOSFET and ground.

19. The arrangement of claim 14 wherein said switching circuitry comprises a differential amplifier, a signal at an output of said differential amplifier being used to provide a voltage at said gate of said depletion mode MOSFET.

20. The arrangement of claim 19 wherein a first input of said differential amplifier is connected to said source and a second input of said differential amplifier is connected to a reference voltage, said reference voltage being at a level ground and a voltage at a source of said depletion mode MOSFET when said input voltage is at a normal level.

21. The arrangement of claim 14 contained within a motor vehicle, said source of an input voltage comprising a generator and a battery, said load comprising a semiconductor component within said motor vehicle, said protective circuit functioning to protect said semiconductor component from a load dump or inductive voltage spike.

22. A method of protecting a load from an excessive current condition, said method comprising the steps of:

connecting a depletion mode MOSFET to an input terminal of said load;

providing an input voltage to said depletion mode MOSFET; and driving a gate of said depletion mode MOSFET in such a way that said MOSFET operates in a linear region when said input voltage is at a normal level and said MOSFET operates in a saturated region when said input voltage reaches a predetermined level above said normal level.

23. The method of claim 22 wherein the step of driving said gate comprises the step of biasing said gate at a voltage equal to a voltage at a source of said depletion mode MOSFET.

24. The method of claim 22 wherein the step of driving said gate comprises the step of biasing said gate at a voltage equal to ground.

25. The method of claim 22 wherein the step of driving said gate comprises the step of biasing said gate at a voltage equal to a reference voltage at a level between a voltage at a source of said depletion mode MOSFET and ground.

26. The method of claim 22 wherein the step of driving said gate comprises the step of biasing said gate at a first voltage when said input voltage is at said normal level and biasing said gate at a second voltage when said input voltage is at said predetermined level above said normal level.

27. The method of claim 26 wherein said first voltage is greater than said second voltage.

28. The method of claim 26 wherein said first voltage is equal to a voltage at a source of said depletion mode MOSFET.

29. The method of claim 26 wherein said second voltage is equal to ground.

30. The method of claim 26 wherein said second voltage is at a level between a voltage at a source of said depletion mode MOSFET and ground.

31. A method of protecting a semiconductor component in a motor vehicle from a load dump or inductive voltage spike, said method comprising the steps of:

connecting a depletion mode MOSFET in a current line between a generator and said semiconductor component;

providing an input voltage to said depletion mode MOSFET; and driving a gate of said depletion mode MOSFET in such a way that said MOSFET operates in a linear region when said input voltage is at a normal level and said MOSFET operates in a saturated region when said load dump or inductive voltage spike exists.

* * * * *

UNITED STATES PATENT AND TRADEMARK OFFICE
CERTIFICATE OF CORRECTION

PATENT NO.   : 5,585,991
DATED        : December 17, 1996
INVENTOR(S)  : Richard K. Williams It is certified that error appears in the above-identified patent and that said Letters Patent is hereby corrected as shown below:

Column 9, line 30, delete ":".

Signed and Sealed this

Tenth Day of June, 1997

Attest:

BRUCE LEHMAN

*Attesting Officer*   Commissioner of Patents and Trademarks